US011723210B2

(12) United States Patent
Yang et al.

(10) Patent No.: US 11,723,210 B2
(45) Date of Patent: Aug. 8, 2023

(54) HIGH SELECTIVITY ISOLATION STRUCTURE FOR IMPROVING EFFECTIVENESS OF 3D MEMORY FABRICATION

(71) Applicant: Taiwan Semiconductor Manufacturing Co., Ltd., Hsinchu (TW)

(72) Inventors: Tsu Ching Yang, Taipei (TW); Feng-Cheng Yang, Zhudong Township (TW); Sheng-Chih Lai, Hsinchu County (TW); Yu-Wei Jiang, Hsinchu (TW); Kuo-Chang Chiang, Hsinchu (TW); Hung-Chang Sun, Kaohsiung (TW); Chen-Jun Wu, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 17/333,300

(22) Filed: May 28, 2021

(65) Prior Publication Data
US 2022/0285395 A1 Sep. 8, 2022

Related U.S. Application Data

(60) Provisional application No. 63/157,217, filed on Mar. 5, 2021.

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC ......... H01L 27/11578; H01L 27/11585; H01L 27/1159; H01L 27/11597; H01L 29/66787;
(Continued)

(56) References Cited

U.S. PATENT DOCUMENTS

2011/0275197 A1* 11/2011 Park .................. H01L 27/11582
257/E21.09
2021/0296360 A1* 9/2021 Hsu ..................... H01L 27/2454
(Continued)

FOREIGN PATENT DOCUMENTS

CN 113517299 A * 10/2021 ............. G11C 11/14
DE 102020130975 A1 * 12/2021 ............ H01L 27/1159

*Primary Examiner* — Matthew E Warren
(74) *Attorney, Agent, or Firm* — Eschweiler & Potashnik, LLC

(57) ABSTRACT

In some embodiments, the present disclosure relates to a method for forming a memory device, including forming a plurality of word line stacks respectively including a plurality of word lines alternatingly stacked with a plurality of insulating layers over a semiconductor substrate, forming a data storage layer along opposing sidewalls of the word line stacks, forming a channel layer along opposing sidewalls of the data storage layer, forming an inner insulating layer between inner sidewalls of the channel layer and including a first dielectric material, performing an isolation cut process including a first etching process through the inner insulating layer and the channel layer to form an isolation opening, forming an isolation structure filling the isolation opening and including a second dielectric material, performing a second etching process through the inner insulating layer on opposing sides of the isolation structure to form source/drain openings, and forming source/drain contacts in the source/drain openings.

20 Claims, 16 Drawing Sheets

(58) Field of Classification Search
CPC .......... H01L 29/6684; H01L 29/78648; H10B 43/00; H10B 43/10; H10B 43/20; H10B 43/30; H10B 51/00; H10B 51/10; H10B 51/20; H10B 51/30
See application file for complete search history.

(56) References Cited

U.S. PATENT DOCUMENTS

| | | | |
|---|---|---|---|
| 2021/0375888 A1* | 12/2021 | Lu | H01L 29/66969 |
| 2021/0408044 A1* | 12/2021 | Chiang | G11C 11/2255 |
| 2022/0028894 A1* | 1/2022 | Yang | H01L 29/78391 |
| 2022/0037364 A1* | 2/2022 | Jiang | H01L 29/7869 |
| 2022/0285400 A1* | 9/2022 | Liou | H01L 21/76804 |

* cited by examiner

1000A

102

1000B

102

118

HIGH SELECTIVITY ISOLATION STRUCTURE FOR IMPROVING EFFECTIVENESS OF 3D MEMORY FABRICATION

REFERENCE TO RELATED APPLICATION

This Application claims the benefit of U.S. Provisional Application No. 63/157,217, filed on Mar. 5, 2021, the contents of which are hereby incorporated by reference in their entirety.

BACKGROUND

Many modern electronic devices contain electronic memory configured to store data. As technology advances at a rapid pace, engineers work to make memory devices smaller, yet more complex to improve and develop electronic devices that are more efficient, more reliable, and have more capabilities. Individual memory cells may be vertically stacked in three-dimensional (3D) memory, allowing for more a greater bit density, and thus more efficient electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
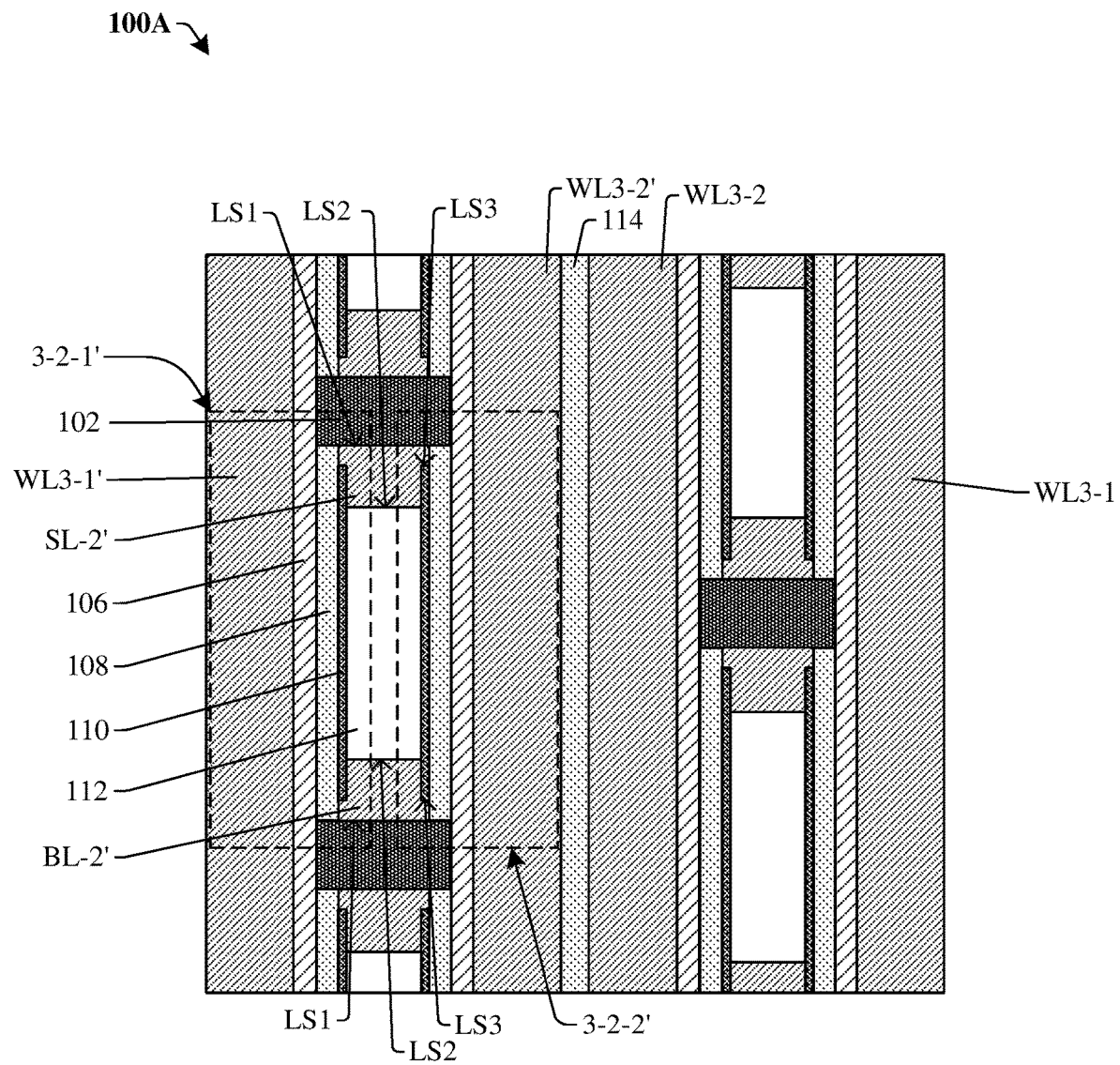
FIGS. 1A-1C illustrate a cross-sectional view and 3D views of some embodiments of a memory device comprising an isolation structure and an inner insulating layer of different materials.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D memory structure includes an array of memory cells arranged in rows and columns. Each memory cell comprises a channel layer, a pair of source/drain regions disposed on one side of the channel layer, and a word line disposed on the other side of the channel layer. The source/drain regions are separated from one another by an inner insulating layer. In some cases, the array of memory cells is formed by firstly forming a plurality of word line stacks over a substrate, a channel material along sidewalls of the word line stacks, and an insulating material between inner sidewalls of the channel material. The insulating material is then patterned by a first etching process to form source/drain openings and an inner insulating layer between the source/drain openings, and a dummy structure is temporally filled in the formed source/drain openings for convenience of subsequent processes. Then an isolation cut process is performed including a second etching process to cut the channel material to form isolation openings and isolated channel layers for different memory cells. The isolation openings are then filled with an isolation structure of a material different than the dummy structure. The dummy structure is selectively removed and replaced with source/drain regions thereafter with the isolation structure in place.

The fabrication process described above is complicated with the dummy structure being formed and removed. In addition, the inner insulating layer and/or the isolation structure may be damaged when removing the dummy structure. This damage can lead to performance issues, and even an electrical short. Alternatively, an etchant with high etching selectivity of the dummy structure and the isolation structure may be needed to avoid damage to the isolation structure, which can be very costly.

In view of the above, the present application is directed to a method for forming a 3D memory cell without using a dummy filling and removing process, and associated device structures. In some embodiments, a plurality of word line stacks is formed and respectively comprising a plurality of word lines alternatively stacked with a plurality of insulating layer. A channel layer is formed along inner sidewalls of the plurality of word line stacks and extending in a first direction. An insulating layer is formed between inner sidewalls of the channel layer. An isolation cut process is performed including a first etching process to etch through the channel layer to form isolation openings and isolated channel layers for different memory cells. The isolation openings are subsequently filled with an isolation structure. Then, a second etching process is performed through the insulating layer on opposite sides of the isolation structure to form source/drain openings, and source/drain contacts fill the source/drain openings. By performing the isolation cut process and forming the isolation structure prior to forming the source/drain openings, the method eliminates the need for a dummy structure comparing to an approach of performing the isolation cut process after forming the source/drain openings. Thus, the fabrication process is simplified. In some embodiments, the isolation structure is of a material that can be etched by the second etching process with a high etching selectivity with respect to the insulation layer such that etching damage to the isolation structure is eliminated during the etching of the source/drain openings. These, in turn, improve the effectiveness of the fabrication of 3D memory.

Figure 1B:
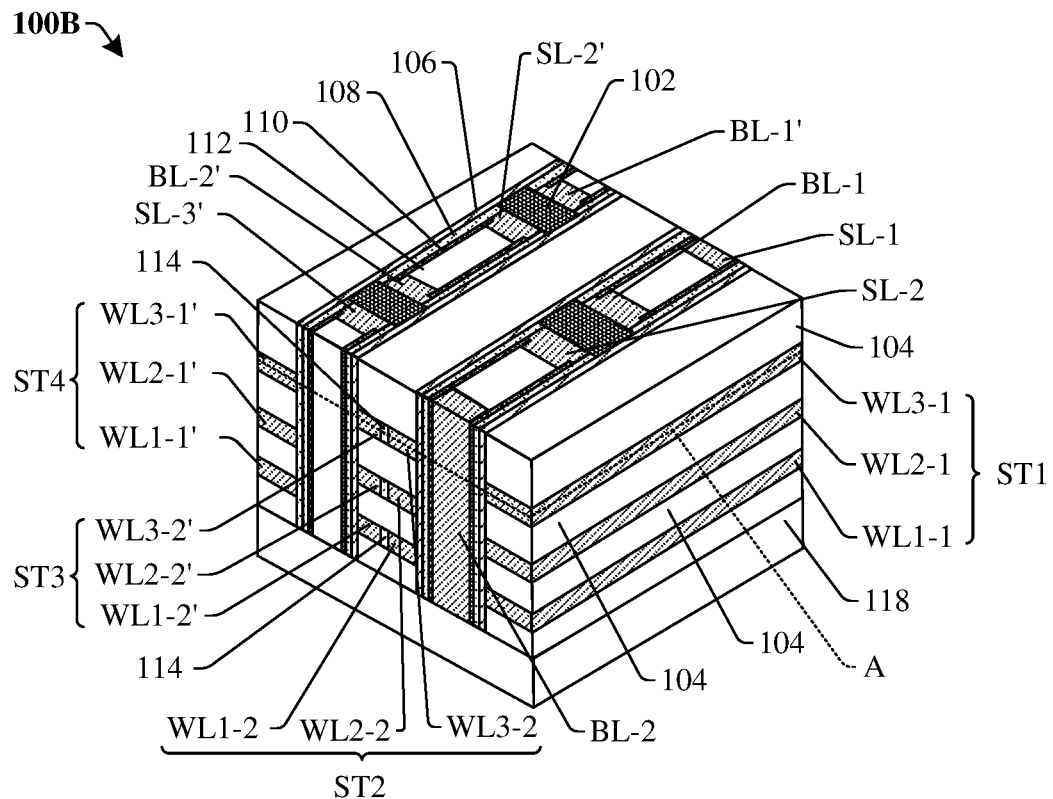
Figure 1C:
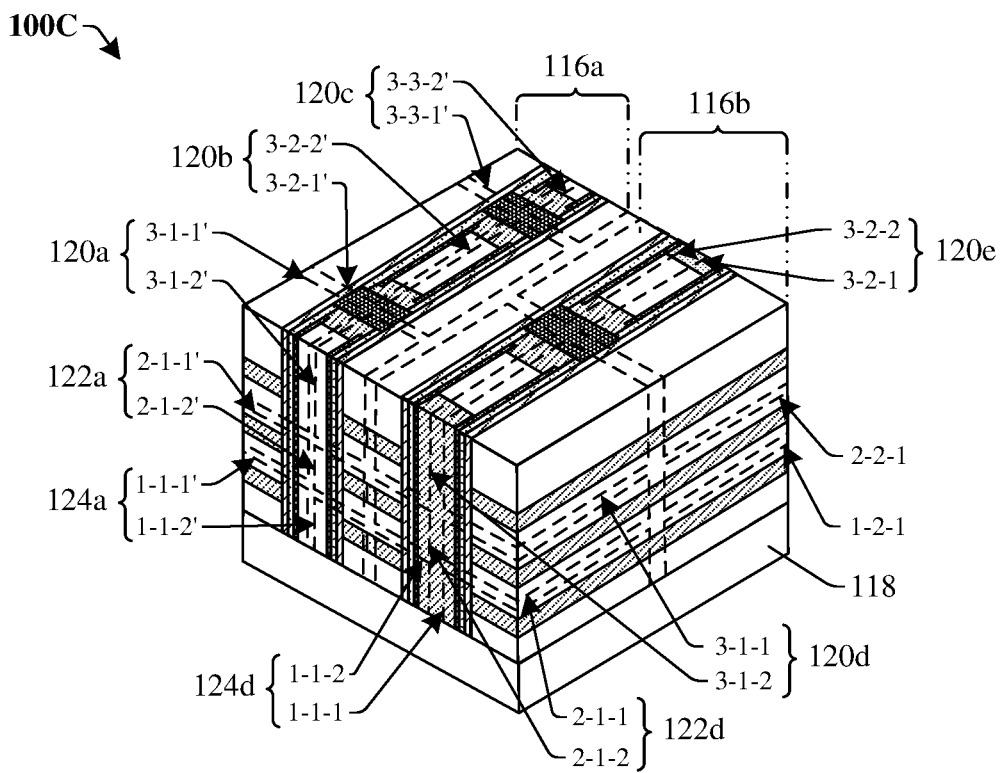

FIGS. 1A-1C illustrate a cross-sectional view 100A and 3D views 100B-100C of some embodiments of a memory device comprising an isolation structure and an inner insulating layer of different materials. The cross-sectional view 100A may be taken along line A in FIG. 1B.

As shown by the cross-sectional view 100A of FIG. 1A, the memory device comprises a first memory cell 3-2-1' comprising a first word line WL3-1'. A data storage layer 106 is disposed along an inner sidewall of the first word line WL3-1'. A channel layer 108 is disposed along an inner sidewall of the data storage layer 106, a dielectric layer 110 is disposed along an inner sidewall of the channel layer 108, and an inner insulating layer 112 is disposed along an inner sidewall of the dielectric layer 110. A pair of source/drain contacts (e.g., a bit line BL-2' and a source line SL-2') are disposed on opposing sides of the inner insulating layer 112, such that the pair of source/drain contacts are laterally separated in a first direction by the inner insulating layer 112. An isolation structure 102 is disposed along the inner sidewall of the data storage layer 106.

In some embodiments, during operation of the first memory cell 3-2-1', to write, a set voltage or a reset voltage is applied from the first word line WL3-1' to the channel layer 108 and the data storage layer 106. The set voltage sets the data storage layer 106 to a first state (e.g., a logical '1'), whereas the reset voltage sets the data storage layer 106 to a second state (e.g., a logical '0'). The data storage layer 106 is employed to store a bit of data as the first state or the second state. To read, a read voltage is applied to the first word line WL3-1'. The read voltage may be between a threshold voltage of the first state and a threshold voltage of the second state, such that the read voltage would cause the channel layer 108 to conduct in one state but not the other. Thus, the state of the bit of data can be read through drain current flowing between the pair of source/drain contacts BL-2', SL-2'.

In some embodiments, the pair of source/drain contacts BL-2', SL-2' may each respectively comprise a first surface LS1 laterally extending in a second direction that is substantially orthogonal to the first direction and contacting the isolation structure 102. In some embodiments, the pair of source/drain contacts BL-2', SL-2' may respectively comprise a second surface LS2 laterally extending in the second direction and contacting the inner insulating layer 112. In some embodiments, the pair of source/drain contacts BL-2', SL-2' may respectively comprise a third surface LS3 laterally extending in the second direction and contacting the dielectric layer 110. In further embodiments, the third surface LS3 is laterally between the first surface LS1 and the second surface LS2 in the first direction. In some embodiments, an inner sidewall of the channel layer 108 contacts the pair of source/drain contacts BL-2', SL-2'. In some embodiments, the pair of source/drain contacts BL-2', SL-2' contacts the inner sidewall of the dielectric layer 110.

In some embodiments, the pair of source/drain contacts BL-2', SL-2' comprises a first portion contacting the isolation structure 102 and a second portion contacting the inner insulating layer 112 and comprising sidewalls connected to sidewalls of the first portion by the third surface, wherein sidewalls of the second portion are laterally between sidewalls of the first portion. In some embodiments, the dielectric layer 110 contacts the sidewalls of the first portion, and the channel layer 108 contacts the sidewalls of the second portion. In some embodiments, a first pair of opposing sidewalls of the isolation structure 102 are parallel and contact the pair of source/drain contacts BL-2', SL-2'. In some embodiments, the isolation structure 102 comprises a second pair of opposing sidewalls, and the isolation structure 102 has a constant width extending continuously between the second pair of opposing sidewalls. In some embodiments, the second pair of opposing sidewalls of the isolation structure 102 are laterally separated from the sidewalls of the second portion of the pair of source/drain contacts BL-2', SL-2'.

The memory device comprises other memory cells similar to the first memory cell 3-2-1' in both structure and operation. For example, the memory device comprises a second memory cell 3-2-2' similar to the first memory cell 3-2-1' in both structure and operation and comprising a second word line WL3-2'. The first memory cell 3-2-1' and the second memory cell 3-2-2' define a first memory cell pair, such that individual memory cells of the first memory cell pair share the pair of source/drain contacts BL-2', SL-2' and are laterally separated from each other in the second direction. In some embodiments, the isolation structure 102 laterally separates the first memory cell pair from one or more memory cell pairs in the first direction, defining a first column of memory cell pairs. In some embodiments, the one or more memory cell pairs are structurally similar to the first memory cell pair. In some embodiments, the first word line WL3-1' and the second word line WL3-2' may laterally extend in the first direction, such that the one or more memory cell pairs comprise the first word line WL3-1' and the second word line WL3-2'. In some embodiments, the memory device further comprises a second column of memory cell pairs structurally similar to the first column of memory cell pairs and comprising a third word line WL3-1 and a fourth word line WL3-2. In further embodiments, the second column of memory cell pairs is laterally separated from the first column of memory cell pairs in the second direction by a filler layer 114.

The isolation structure 102 may be a material different than the inner insulating layer 112. In some embodiments, the isolation structure 102 may be or otherwise comprise, for example, silicon oxycarbide, silicon oxycarbonitride, aluminum oxide, hafnium dioxide, lanthanum oxide, some other suitable oxide-doped or metal oxide material(s) that can be etched with a high etching selectivity with respect to the inner insulating layer 112, or some other suitable material(s) that can be etched with a high etching selectivity with respect to the inner insulating layer 112. In some embodiments, the high etching selectivity is a ratio of greater than 1000:1. At an etching selectivity lower than 1000:1, the isolation structure 102 may be damaged during an etch of the inner insulating layer 112. In some embodiments, the isolation structure 102 comprises a different material than that of the inner insulating layer 112.

In some embodiments, the inner insulating layer 112 may be or otherwise comprise, for example, an oxide or some other suitable material(s). In some embodiments, the dielectric layer 110 may be or otherwise comprise, for example, aluminum oxide, hafnium dioxide, lanthanum oxide, titanium oxide, or some other suitable high-k dielectric material(s). In some embodiments, the channel layer 108 may be or otherwise comprise, for example, indium gallium zinc oxide, zinc oxide, tin oxide, or some other suitable oxide semiconductor material(s). In some embodiments, the data storage layer 106 may be or otherwise comprise, for example, a ferroelectric material (hafnium zirconium oxide, hafnium oxide, or some other suitable ferroelectric material(s)), a magnetic tunnel junction (MTJ), or some other suitable data storage structure(s). In some embodiments, the first word line WL3-1', the second word line WL3-2', the third word line WL3-1, and the fourth word line WL3-2 are conductive and may be or otherwise comprise, for example, tungsten, titanium nitride, aluminum copper, or some other suitable material(s). In some embodiments, pair of source/drain contacts BL-2', SL-2' are conductive and may be or otherwise comprise, titanium nitride, tungsten, ruthenium, or some other suitable material(s). In some embodiments, the filler layer 114 may be or otherwise comprise, for example, a nitride (e.g., silicon nitride, silicon oxynitride), or some other suitable material(s).

Since the isolation structure 102 comprises a material that may be etched with a high etching selectivity with respect to the inner insulating layer 112, etching damage to the isolation structure 102 is eliminated during formation of the pair of source/drain contacts. This, in turn, can improve the effectiveness of the fabrication of 3D memory.

As shown by the 3D view 100B of FIG. 1B, in some embodiments, the memory device comprises a plurality of word line stacks ST1, ST2, ST3, ST4 overlying a semiconductor substrate 118. Respective word line stacks ST1, ST2, ST3, ST4 comprise a plurality of word lines alternatingly stacked with a plurality of insulating layers 104. For example, a first word line stack ST1 comprises a plurality of word lines WL 1-1, 2-1, 3-1 alternatingly stacked with the plurality of insulating layers 104. A second word line stack ST2 comprises a plurality of word lines WL 1-2, 2-2, 3-2 alternatingly stacked with the plurality of insulating layers 104. A third word line stack ST3 comprises a plurality of word lines WL 1-2', 2-2', 3-2' alternatingly stacked with the plurality of insulating layers 104. A fourth word line stack ST4 comprises a plurality of word lines WL 1-1', 2-1', 3-1' alternatingly stacked with the plurality of insulating layers 104. In some embodiments, the word lines WL 1-2, 2-2, 3-2 of the second word line stack ST2 are respectively separated from the word lines WL 1-2', 2-2', 3-2' of the third word line stack ST3 by the filler layer 114. A data storage layer 106 is disposed along opposing sidewalls of the plurality of word line stacks ST1, ST2, ST3, ST4. A channel layer 108 is disposed along opposing sidewalls of the data storage layer 106, a dielectric layer 110 is disposed along opposing sidewalls of the channel layer 108, and an inner insulating layer 112 is disposed between opposing sidewalls of the dielectric layer 110. A plurality of pairs of source/drain contacts BL-1', SL-2', BL-2', SL-3', SL-1, BL-1, SL-2, BL-2 (e.g., a bit line and a source line) are disposed on opposing sides of the inner insulating layer 112, such that each source/drain contact of the pairs of source/drain contacts BL-1', SL-2', BL-2', SL-3', SL-1, BL-1, SL-2, BL-2 are laterally separated from one another in a first direction by the inner insulating layer 112. An isolation structure 102 is disposed between the opposing sidewalls of the data storage layer 106.

The plurality of pairs of source/drain contacts BL-1', SL-2', BL-2', SL-3', SL-1, BL-1, SL-2, BL-2 comprises a first bit line BL-1' and a first source line (not shown), a second bit line BL-2' and a second source line SL-2', a third bit line (not shown) and a third source line SL-3', a fourth bit line BL-1 and a fourth source line SL-1, and a fifth bit line BL-2 and a fifth source line SL-2.

In some embodiments, the semiconductor substrate 118 may be or otherwise comprise, for example, a bulk silicon substrate, a bulk germanium substrate, a group III-V substrate, or some other suitable semiconductor substrate. In some embodiments, the plurality of insulating layers 104 may be or otherwise comprise, for example, an oxide or some other suitable material(s). In some embodiments, the plurality of insulating layers 104 and the inner insulating layer 112 comprise the same material(s). In some embodiments, the plurality of word lines is conductive and may be or otherwise comprise, for example, tungsten, titanium nitride, aluminum copper, or some other suitable material(s). In some embodiments, the plurality of pairs of source/drain contacts BL-1', SL-2', BL-2', SL-3', SL-1, BL-1, SL-2, BL-2 are conductive and may be or otherwise comprise, titanium nitride, tungsten, ruthenium, or some other suitable material(s).

As shown by the 3D view 100C of FIG. 1C, the memory device comprises a plurality of memory cells. In some embodiments, the memory cells may be structurally and operationally similar to memory cell 3-2-1' described in FIG. 1. The plurality of memory cells is separated into a plurality of vertically stacked layers of memory cells. In some embodiments, two or more memory cell pairs may be vertically stacked over one another. The plurality of memory cells is further separated into a first column of memory cell pairs 116a and a second column of memory cell pairs 116b laterally extending in a first direction. Individual memory cells of the first column of memory cell pairs 116a are labeled z-y-x', and individual memory cells of the second column of memory cell pairs 116b are labeled z-y-x, wherein z represents a vertical position of the memory cell (e.g., 1, 2, 3), wherein y represents a lateral position of the memory cell in the first direction (e.g., 1, 2, 3), and wherein x represents a pair identifier of the memory cell (e.g., 1, 2).

Within an upper layer of the plurality of vertically stacked layers, the first column of memory cell pairs 116a comprises a first upper memory cell pair 120a, which comprises memory cells 3-1-1' and 3-1-2', a second upper memory cell pair 120b, which comprises memory cells 3-2-1' and 3-2-2', and a third upper memory cell pair 120c, which comprises memory cells 3-3-1' and 3-3-2'. The second column of memory cell pairs 116b comprises a fourth upper memory cell pair 120d, which comprises memory cells 3-1-1 and 3-1-2, and a fifth upper memory cell pair 120e, which comprises memory cells 3-2-1 and 3-2-2. A middle layer of the plurality of vertically stacked layers is substantially similar to the upper layer, such that individual memory cells of the middle layer have the same y-x positions as corresponding memory cells of the upper layer and a z position of 2. In some embodiments, the middle layer may comprise, for example, memory cells 2-1-1' and 2-1-2' (e.g., first middle memory cell pair 122a), 2-1-1 and 2-1-2 (fourth middle memory cell pair 122d), and 2-2-1. A lower layer of the plurality of vertically stacked layers is substantially similar to the upper layer, such that individual memory cells of the lower layer have the same y-x positions as corresponding memory cells of the upper layer and a z position of 1. In some embodiments, the lower layer may comprise, for example, memory cells 1-1-1' and 1-1-2' (e.g., first lower memory cell pair 124a), 1-1-1 and 1-1-2 (e.g., fourth lower memory cell pair 124d), and 1-2-1.

Figure 2:
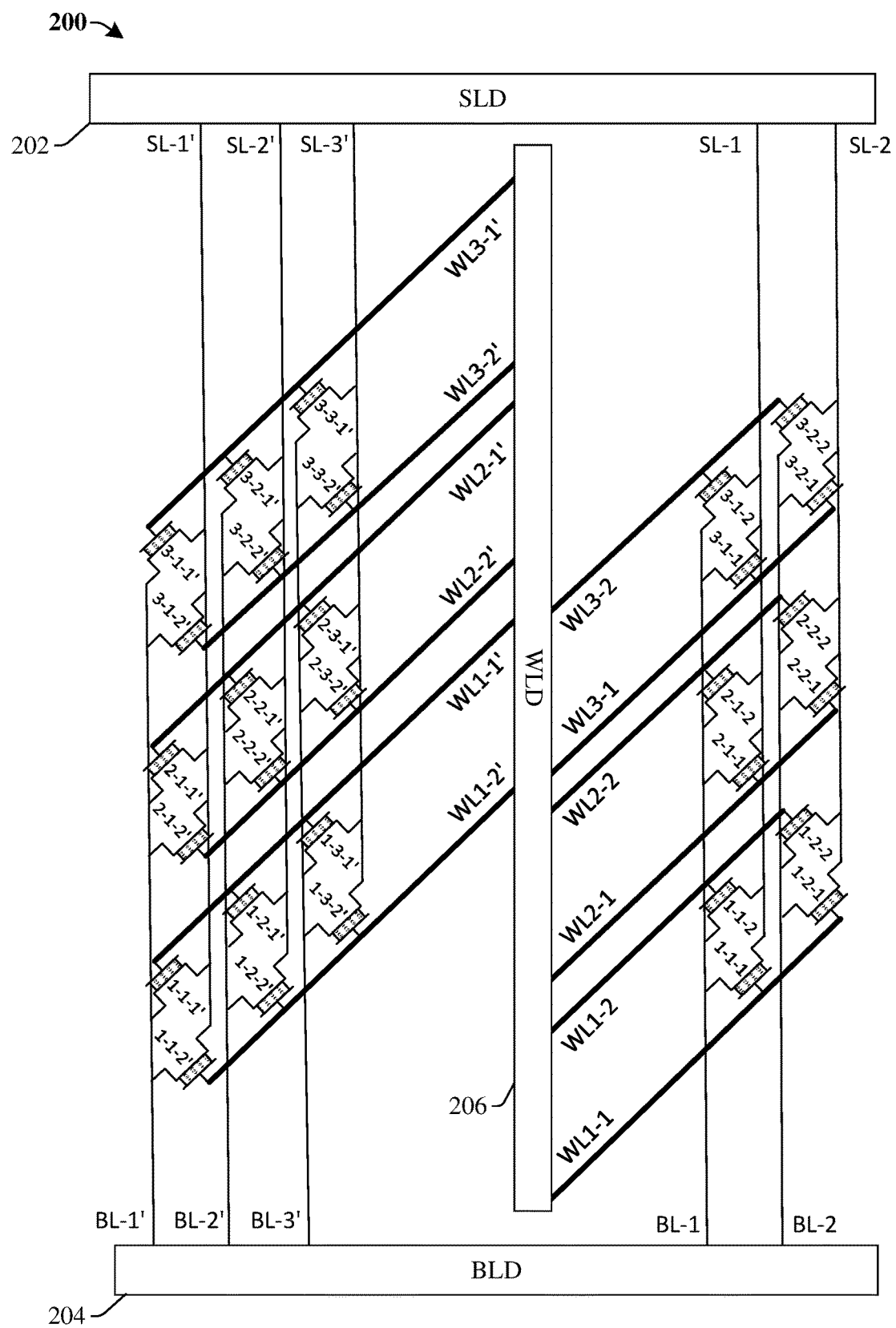
FIG. 2 illustrates a block diagram of some embodiments of a 3D memory device.

FIG. 2 illustrates a block diagram 200 of some embodiments of a 3D memory device. The memory device may be as described in FIGS. 1A-1B. In some embodiments, the memory device comprises plurality of memory cells separated into a first column of memory cell pairs and a second column of memory cell pairs. Individual memory cells of the first column of memory cell pairs are labeled z-y-x', and individual memory cells of the second column of memory cell pairs are labeled z-y-x, wherein z represents a vertical position of the memory cell (e.g., 1, 2, 3), wherein y represents a lateral position of the memory cell (e.g., 1, 2, 3), and wherein x represents a pair identifier of the memory cell (e.g., 1, 2). In some embodiments, the first column of memory cell pairs comprises eighteen memory cells. In further embodiments, there are three layers of memory cells vertically stacked, such that corresponding layers comprise three memory cell pairs. In some embodiments, the second column of memory cell pairs comprises twelve memory cells. In further embodiments, there are three layers of memory cells vertically stacked, such that corresponding layers comprise two memory cell pairs. In some embodiments, there may be more than two columns of memory cell pairs. In some embodiments, there may be more than three layers of memory cells.

The memory device further comprises a plurality of word lines electrically coupled to respective memory cells of the plurality of memory cells. Individual word lines of the first column of memory cell pairs are labeled WLz-x', and individual word lines of the second column of memory cell pairs are labeled WLz-x, wherein z represents a vertical position of the memory cell (e.g., 1, 2, 3), and wherein x represents a pair identifier of the memory cell (e.g., 1, 2), such that in each column of memory cell pairs, each memory cell with a common z and x position share a common word line. A plurality of pairs of bit lines and source lines (e.g., pairs of source/drain contacts) are also electrically coupled to respective memory cells of the plurality of memory cells. Individual pairs of bit lines and source lines of the first column of memory cell pairs are respectively labeled BL-y' and SL-y', and individual pairs of bit lines and source lines of the second column of memory cell pairs are respectively labeled BL-y and SL-y, wherein y represents a lateral position of the memory cell (e.g., 1, 2, 3), such that in each column of memory cell pairs, respective pairs of bit lines and source lines extend vertically through each layer of memory cells and are shared by each of the corresponding pair of memory cells.

In some embodiments, each source line (e.g., SL-1', SL-2', SL-3', SL-1, SL-2) is connected to a source line decoder SLD 202. In some embodiments, each bit line (e.g., BL-1', BL-2', BL-3', BL-1, BL-2) is connected to a bit line decoder BLD 204. In some embodiments, each word line (e.g., WL1-1', WL2-1', WL3-1', WL1-2', WL2-2', WL3-2', WL1-1, WL2-1, WL3-1, WL1-2, WL2-2, WL3-2) is connected to a word line decoder WLD 206.

With reference to FIGS. 3-14, a series of top views and 3D views 300A-1400B illustrate some embodiments of a method for forming a memory device comprising an isolation structure that may be etched with a high etching selectivity with respect to an inner insulating layer. In some embodiments, the memory device may be the memory device of FIGS. 1A-1C. Although FIGS. 3-14 are described in relation to a method, it will be appreciated that the structures disclosed in FIGS. 3-14 are not limited to such a method, but instead may stand alone as structures independent of the method.

Figure 3:
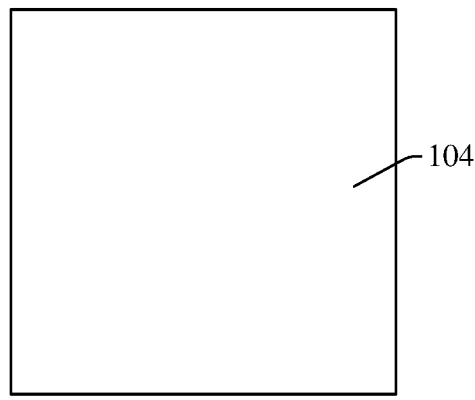
FIGS. 3-14 illustrate a series of top views and 3D views of some embodiments of a method for forming a memory device comprising performing an isolation cut to isolate memory cells prior to pulling back inner insulating layer for forming source/drain regions.
Figure 3:
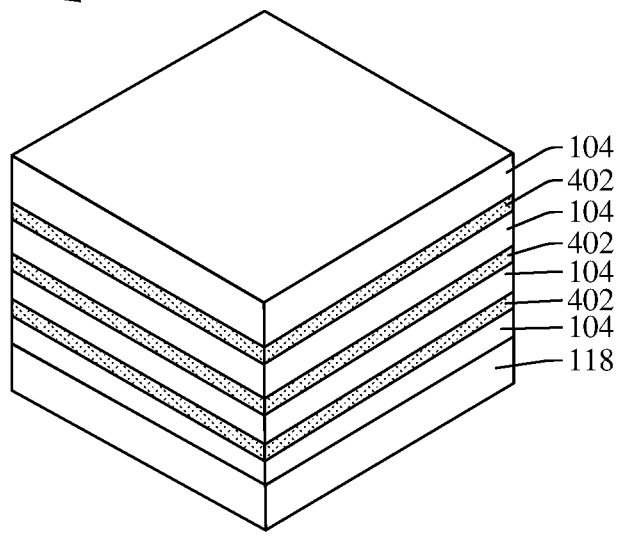

As illustrated by the top view 300A and the 3D view 300B of FIG. 3, a plurality of insulating layers 104 are alternatingly formed with a plurality of filler layers 402 over a semiconductor substrate 118. In some embodiments, the plurality of filler layers 402 may be or otherwise comprise, for example, a nitride (e.g., silicon nitride, silicon oxynitride), or some other suitable material(s). In some embodiments, the plurality of insulating layers 104 and the plurality of filler layers 402 are formed by way of a deposition process (e.g., a chemical vapor deposition (CVD) process, a plasma enhanced CVD process, a physical vapor deposition process, or the like).

Figure 4:
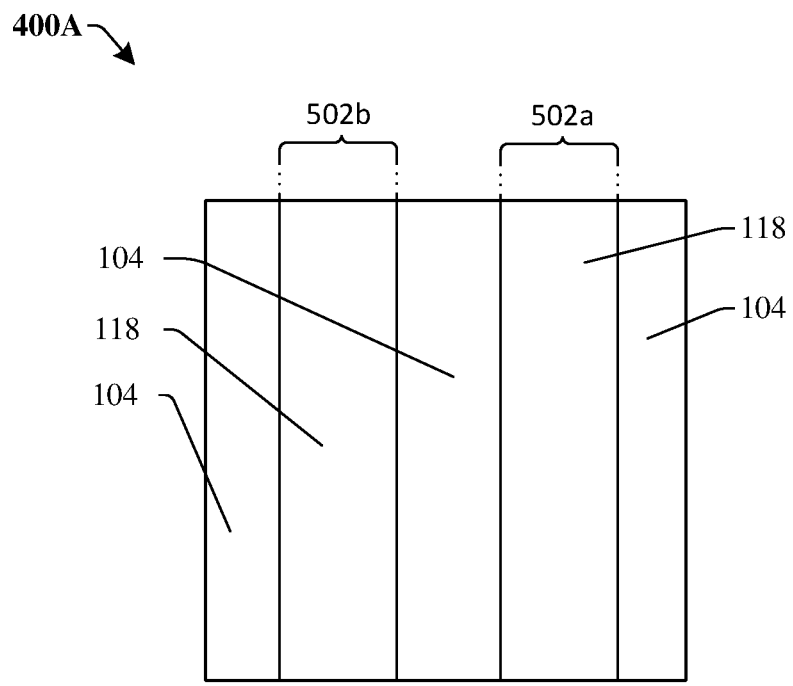
Figure 4:
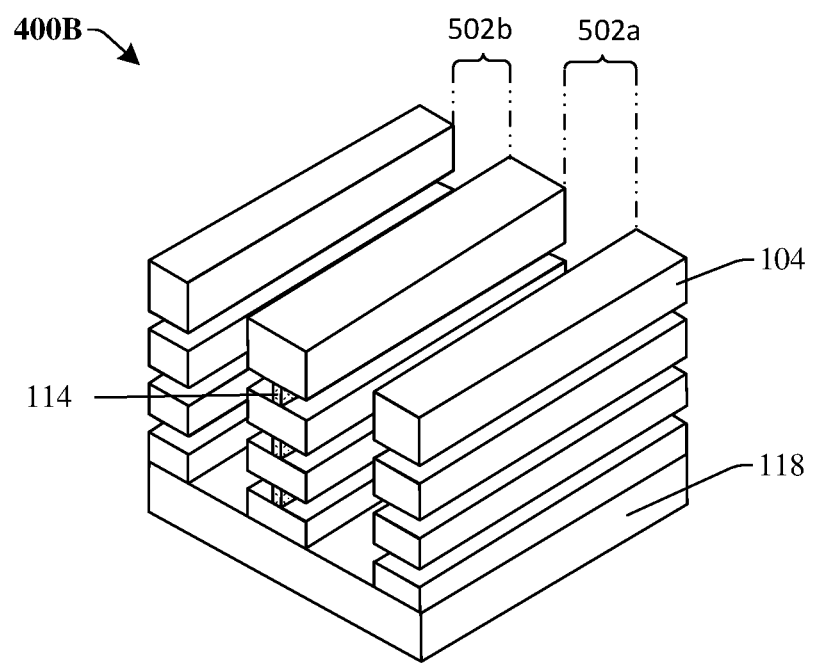

As illustrated by the top view 400A and the 3D view 400B of FIG. 4, a first trench 502a and a second trench 502b are formed into the plurality of insulating layers 104 and the plurality of filler layers 402 to define inner sidewalls of the plurality of insulating layers 104 and inner sidewalls of the plurality of filler layers 402. The first trench 502a and the second trench 502b extend in a first direction and are separated by the plurality of insulating layers 104 in a second direction that may be substantially orthogonal to the first direction. Portions of the plurality of filler layers 402 are then etched away by, for example, a wet etching process to define a plurality of spaces between the plurality of insulating layers 104. In some embodiments, a remaining portion of the plurality of filler layers 402 may be referred to as a filler layer 114.

Figure 5:
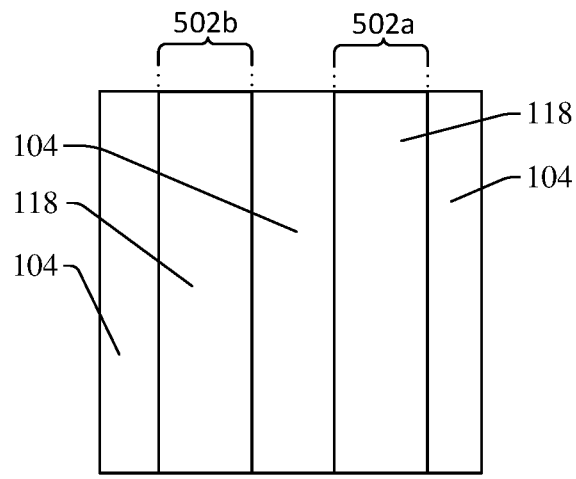
Figure 5:
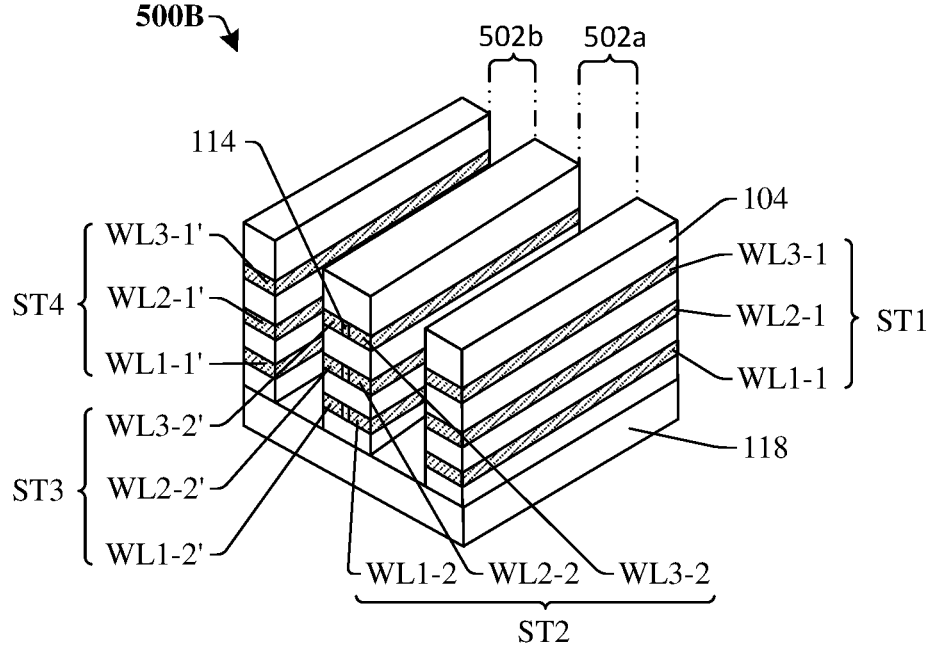

As illustrated by the top view 500A and the 3D view 500B of FIG. 5, a first conductive material is then deposited into the plurality of spaces, and a removal process removes excess amounts of the first conductive material. Respective portions of the first conductive material and the plurality of insulating layers 104 define a plurality of word line stacks ST1, ST2, ST3, ST4 respectively comprising a plurality of word lines alternatingly stacked with the plurality of insulating layers 104. A first word line stack ST1 of the plurality of word line stacks ST1, ST2, ST3, ST4 comprises a first lower word line WL1-1, a first middle word line WL2-1, and a first upper word line WL3-1. A second word line stack ST2 of the plurality of word line stacks ST1, ST2, ST3, ST4 comprises a second lower word line WL1-2, a second middle word line WL2-2, and a second upper word line, WL3-2. A third word line stack ST3 of the plurality of word line stacks ST1, ST2, ST3, ST4 comprises a third lower word line WL 1-2', a third middle word line WL 2-2', and a third upper word line WL 3-2'. A third fourth word line stack ST4 of the plurality of word line stacks ST1, ST2, ST3, ST4 comprises a fourth lower word line WL 1-1', a fourth middle word line WL2-1', and a fourth upper word line WL3-1'. In some embodiments, the third lower word line WL1-2' is separated from the fourth second lower word line WL1-2 by the filler layer 114. In further embodiments, the second middle word line WL2-2' is also separated from the second middle word line WL2-2 by the filler layer 114 and the third upper word line WL3-2' is also separated from the second upper word line WL3-2 by the filler layer 114. In some embodiments, the filler layer 114 separates respective word lines from the plurality of insulating layers 104.

The first trench 502a and the second trench 502b may be etched by, for example, a first etching process, such as a dry etch and/or a wet etch. In various embodiments, the first etching process comprises a dry etch utilizing a plasma etchant, an ion bombardment etchant, or the like, and/or may utilize a wet etchant comprising hydrofluoric acid (HF), potassium hydroxide (KOH), an alkali wet etchant, or the like. In various embodiments, the wet etch may utilize a wet etchant comprising phosphoric acid ($H_3PO_4$), hydrofluoric acid (HF), potassium hydroxide (KOH), an alkali wet etchant, or the like. The removal process may be or otherwise comprise, for example, a wet etch. The first conductive material may be deposited by way of a deposition process (e.g., an atomic layer deposition (ALD) process, a chemical vapor deposition (CVD) process, a physical vapor deposition (PVD) process, a sputtering process, a plating process (e.g., an electroplating process, an electro-less plating process), or the like).

Figure 6:
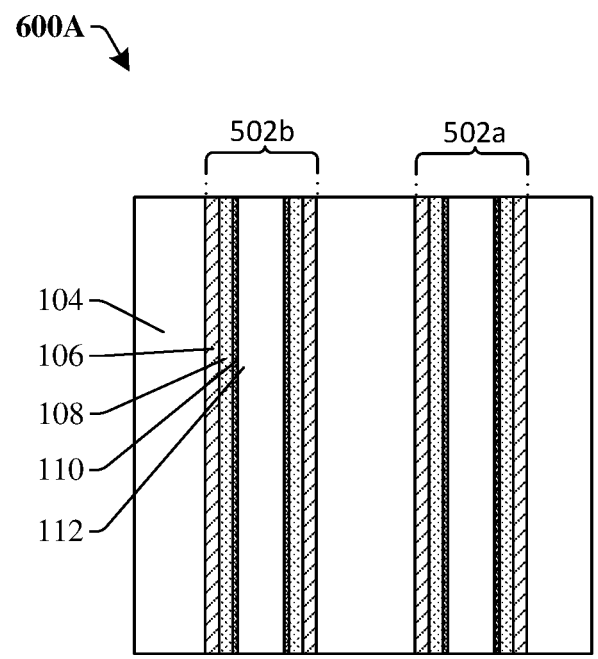
Figure 6:
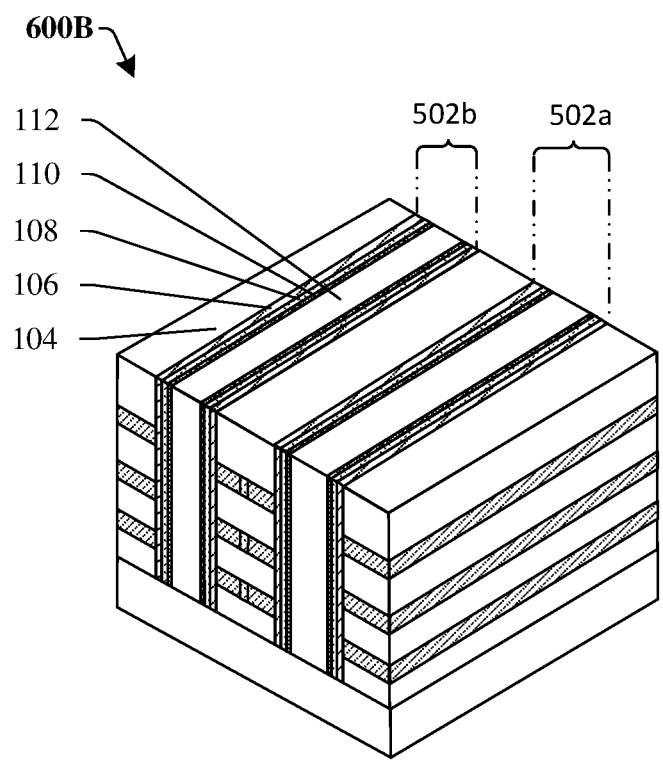

As illustrated by the top view 600A and the 3D view 600B of FIG. 6, a data storage layer 106 is formed over the plurality of insulating layers 104, in the first trench 502a and the second trench 502b, and along the inner sidewalls of the plurality of insulating layers 104 and inner sidewalls of the plurality of word lines. A first removal process then removes lateral portions of the data storage layer 106. A channel layer 108 is then formed over the plurality of insulating layers 104, in the first trench 502a and the second trench 502b, and along inner sidewalls of the data storage layer 106. A second removal process then removes laterally extending portions of the data storage layer 106. A dielectric layer 110 is then formed over the plurality of insulating layers 104, in the first trench 502a and the second trench 502b, and along inner sidewalls of the channel layer 108. A third removal process then removes laterally extending portions of the channel layer 108. An inner insulating layer 112 is then formed between inner sidewalls of the dielectric layer 110 to fill the first trench 502a and the second trench 502b. In some embodiments, the inner insulating layer 112 then undergoes a first planarization process to remove excess material.

The first removal process, the second removal process, and the third removal process may be or comprise, for example, a wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like. The first planarization process may be or otherwise comprise, for example, a chemical-mechanical planarization (CMP), grinding, an etch, or some other suitable process. The data storage layer 106, the channel layer 108, the dielectric layer 110, and the inner insulating layer 112 may be formed by, for example, deposition processes (e.g., a chemical vapor deposition (CVD) process, a plasma enhanced CVD process, a physical vapor deposition process, or the like).

Figure 7:
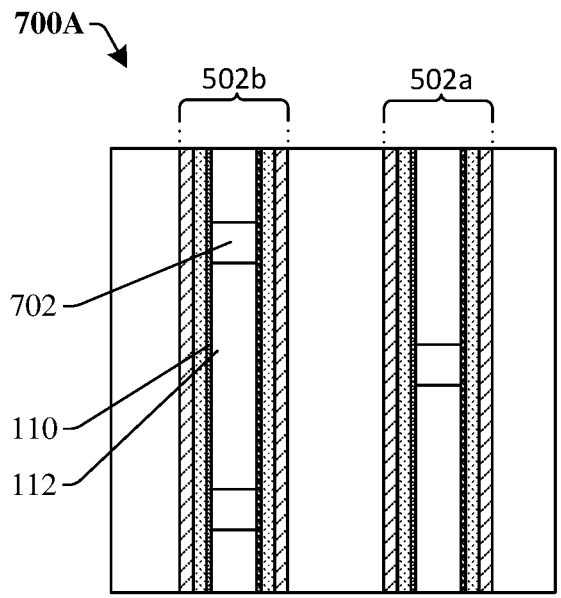
Figure 7:
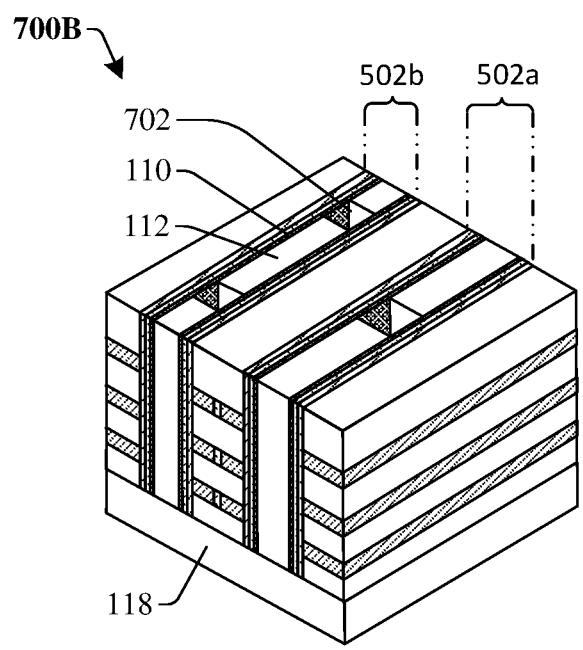

As illustrated by the top view 700A and the 3D view 700B of FIG. 7, in the first trench 502a and the second trench 502b, one or more insulating openings 702 are etched into the inner insulating layer 112, leaving first portions of the dielectric layer 110 exposed. In some embodiments, the one or more insulating openings 702 extend through the inner insulating layer 112 and may extend from a top surface of the inner insulating layer 112 to a top surface of the semiconductor substrate 118. The one or more insulating openings 702 may be etched by, for example, wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like.

Figure 8:
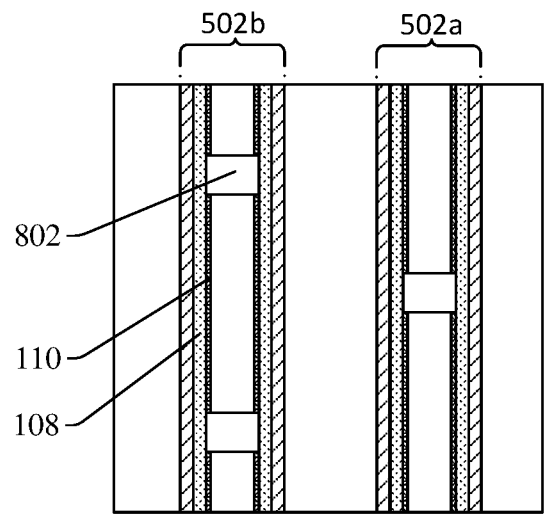
Figure 8:
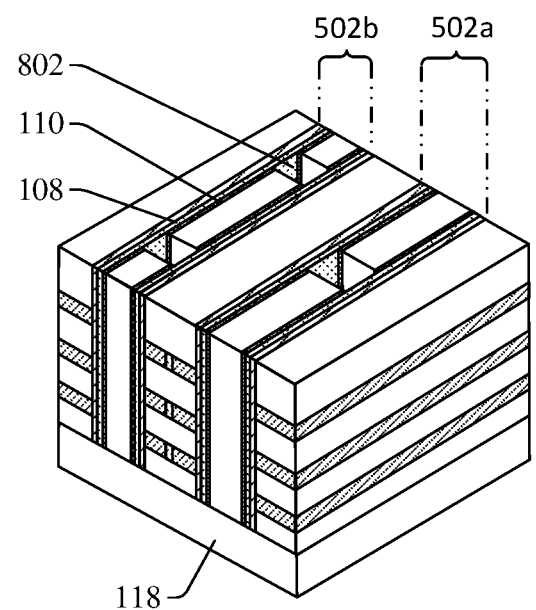

As illustrated by the top view 800A and the 3D view 800B of FIG. 8, in the first trench 502a and the second trench 502b, the first exposed portions of the dielectric layer 110 are etched away, leaving first portions of the channel layer 108 exposed and defining one or more dielectric openings 802. In some embodiments, the exposed portions of the dielectric layer 110 are etched from a top surface of the inner insulating layer 112 to a top surface of the semiconductor substrate 118. The dielectric layer 110 may be etched by, for example, a wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like.

Figure 9:
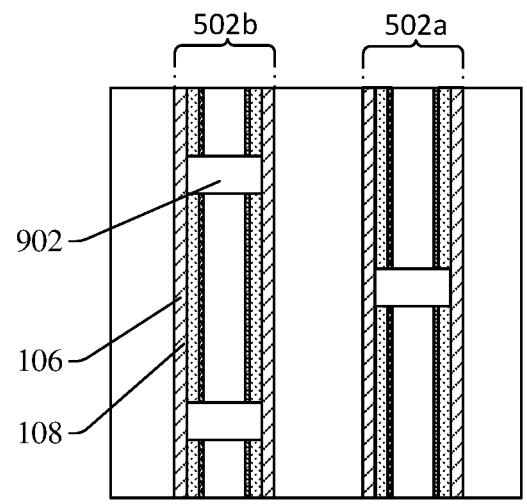
Figure 9:
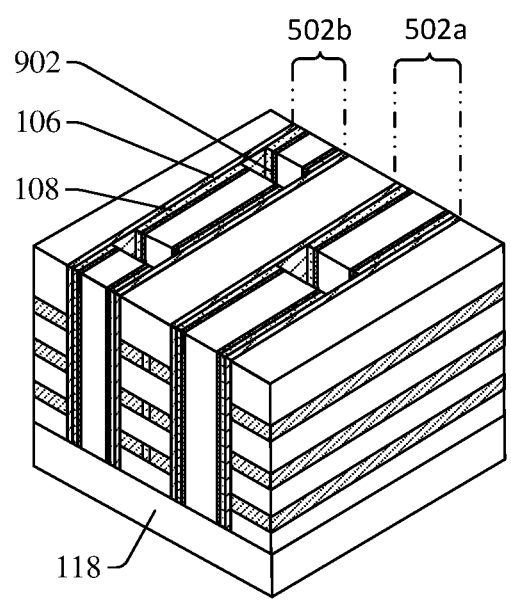

As illustrated by the top view 900A and the 3D view 900B of FIG. 9, in the first trench 502a and the second trench 502b, the first exposed portions of the channel layer 108 are etched away, leaving portions of the data storage layer 106 exposed and defining an isolation opening 902. In some embodiments, the first exposed portions of the channel layer 108 are etched from a top surface of the inner insulating layer 112 to a bottom surface of the inner insulating layer 112. The channel layer 108 may be etched by, for example, a wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like.

Figure 10:
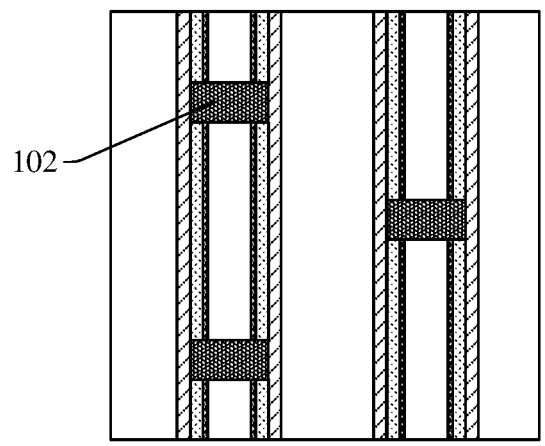
Figure 10:
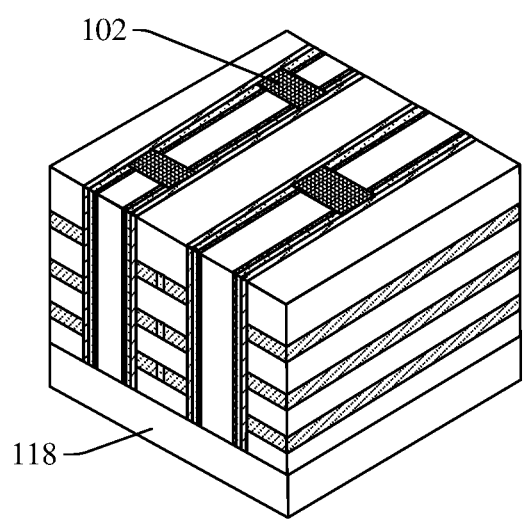

As illustrated by the top view 1000A and the 3D view 1000B of FIG. 10, an isolation structure 102 is formed in respective ones of the isolation opening 902. In some embodiments, the isolation structure 102 undergoes a second planarization process to remove excess material. In some embodiments, the isolation structure 102 extends through the inner insulating layer 112 and may extend from a top surface of the inner insulating layer 112 to a top surface of the semiconductor substrate 118. The isolation structure 102 may be formed by, for example, deposition processes (e.g., a chemical vapor deposition (CVD) process, a plasma enhanced CVD process, a physical vapor deposition process, or the like). The second planarization process may be or otherwise comprise, for example, a chemical-mechanical planarization (CMP), grinding, an etch, or some other suitable process.

Figure 11:
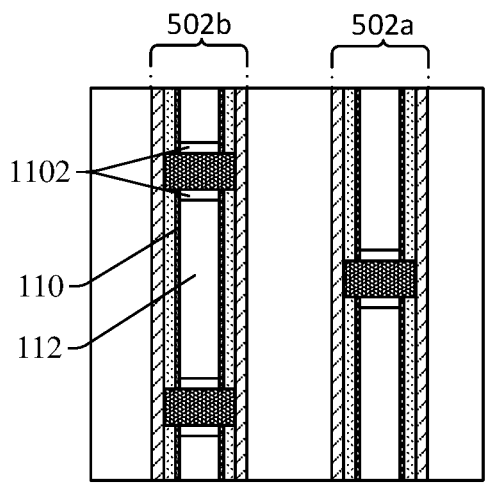
Figure 11:
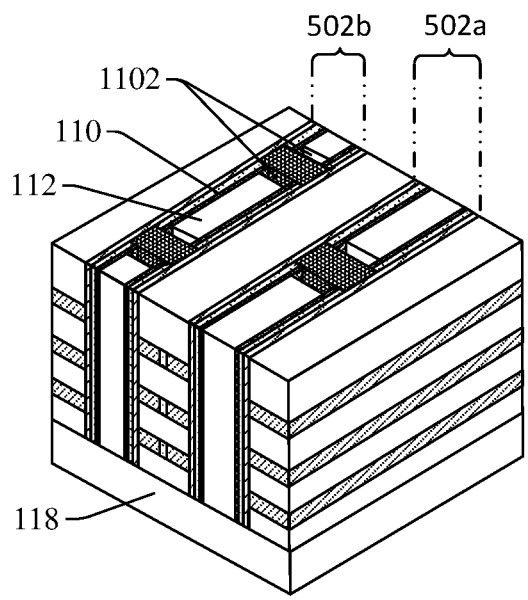

As illustrated by the top view 1100A and the 3D view 1100B of FIG. 11, in the first trench 502a and the second trench 502b, portions of the inner insulating layer 112 on opposing sides of the isolation structure 102 are etched to form one or more pairs of openings 1102, leaving second portions of the dielectric layer 110 exposed. In some embodiments, the inner insulating layer 112 is etched from a top surface of the inner insulating layer 112 to a bottom surface of the inner insulating layer 112. The inner insulating layer 112 may be etched by, for example, a wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like.

Figure 12:
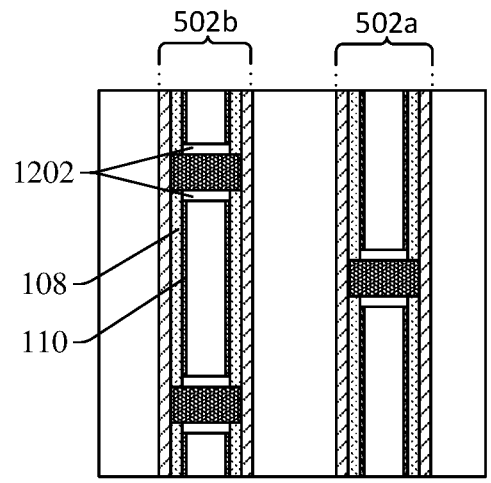
Figure 12:
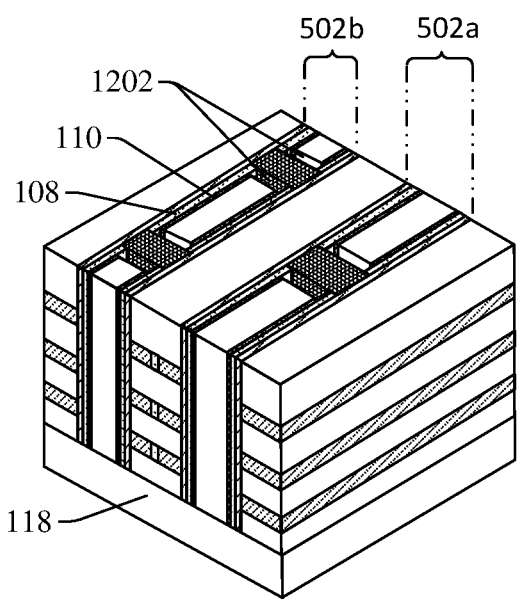

As illustrated by the top view 1200A and the 3D view 1200B of FIG. 12, in the first trench 502a and the second trench 502b, the second exposed portions of the dielectric layer 110 are etched away, leaving second portions of the channel layer 108 exposed and defining one or more pairs of dielectric openings 1202. In some embodiments, the second exposed portions of the dielectric layer 110 are etched from a top surface of the inner insulating layer 112 to a bottom surface of the inner insulating layer 112. The exposed portions of the dielectric layer 110 may be etched by, for example, a wet etching process and/or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like.

Figure 13:
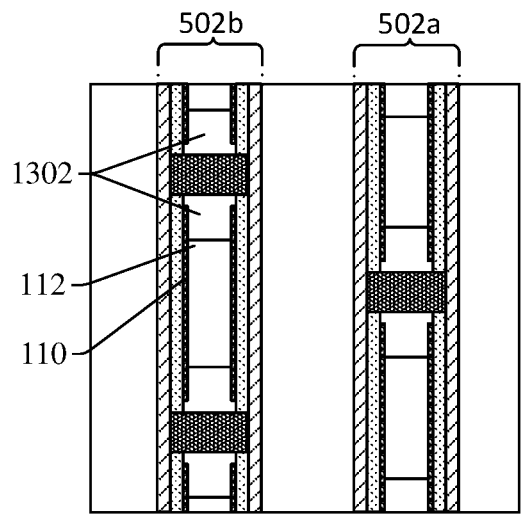
Figure 13:
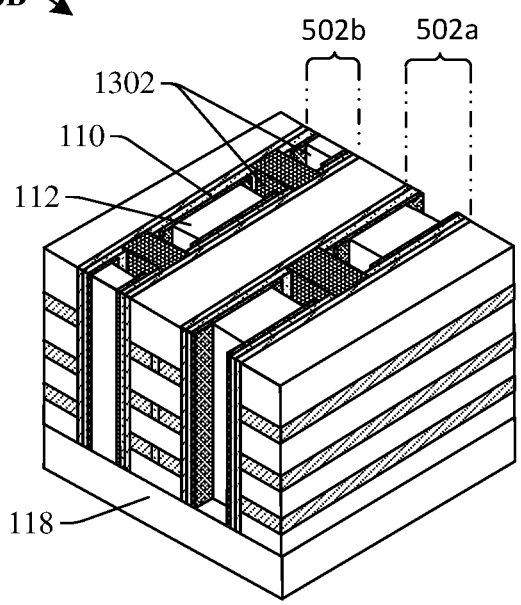

As illustrated by the top view 1300A and the 3D view 1300B of FIG. 13, in the first trench 502a and the second trench 502b, a pullback etch is performed on the inner insulating layer 112 on the opposite sides of the isolation structure 102, leaving second portions of the dielectric layer 110 exposed and defining source/drain openings 1302. The inner insulating layer 112 is etched with a high etching selectivity with respect to the isolation structure 102. This eliminates etching damage to the isolation structure 102 during the etching of the source/drain openings 1302. This, in turn, effectively separates adjacent memory cell pairs in the first and second trenches 502a, 502b, improving an effectiveness of the memory device. In some embodiments, the inner insulating layer 112 may be etched with an etching selectivity with respect to the isolation structure 102 of at least 1000:1. In some embodiments, the inner insulating layer 112 is etched from a top surface of the inner insulating layer 112 to a bottom surface of the inner insulating layer 112. The pullback etch may be or otherwise comprise, for example, a wet etching process. In various embodiments, the wet etching process may utilize a wet etchant comprising hydrofluoric acid (HF), potassium hydroxide (KOH), an alkali wet etchant, a fluoride-based chemical or gas, or the like.

Figure 14:
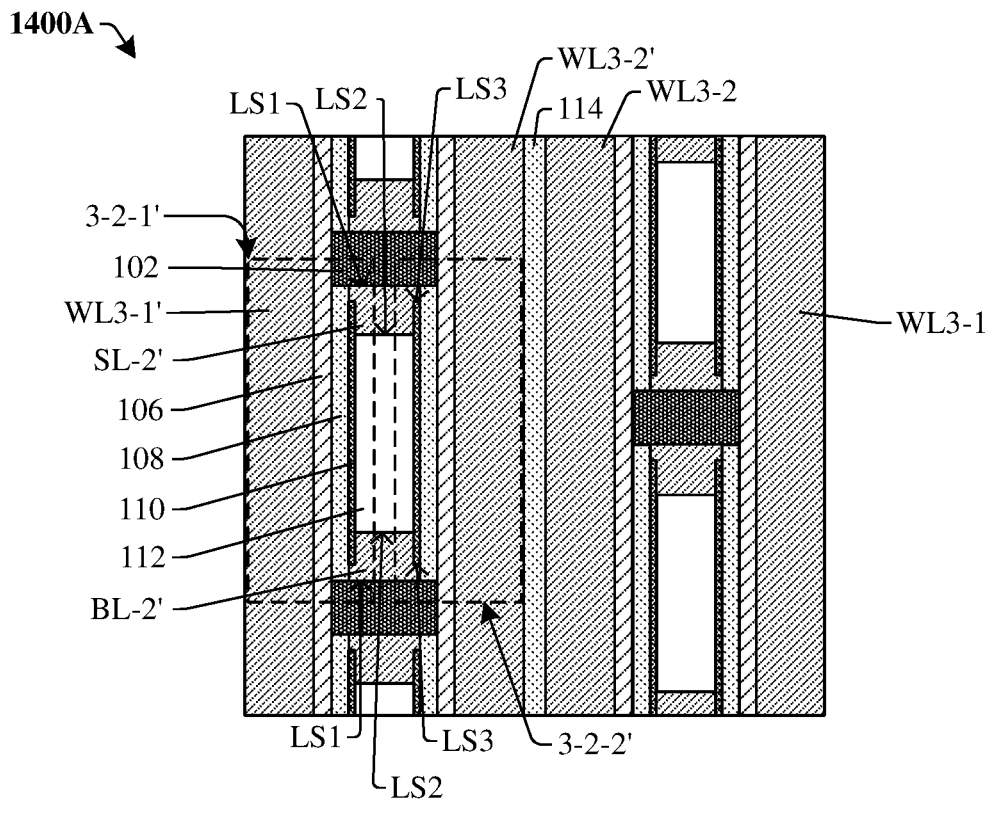
Figure 14:
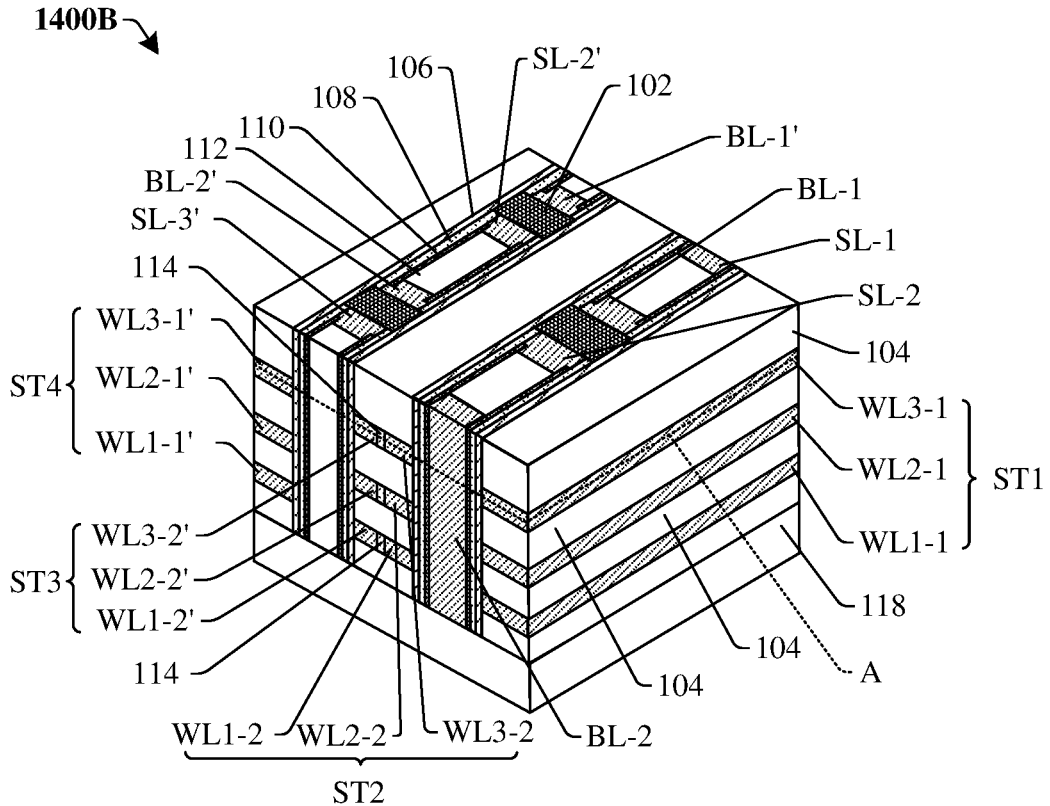

As illustrated by the top view 1400A and the 3D view 1400B of FIG. 14, a second conductive material is formed within the source/drain openings 1302, defining a pair of source/drain contacts. Respective pairs of source/drain contacts comprise a source line (e.g., SL-1, SL-2, SL2', SL-3') and a bit line (e.g., BL-1, BL-2, BL-1', BL-2') extending vertically through a plurality of layers of memory cells. In some embodiments, the second conductive material undergoes a third planarization process to remove excess material. In some embodiments, after forming the second conductive material, the isolation structure 102 and the filler layer 114 separate the memory structure into a first column of memory cell pairs, a second column of memory cell pairs, a lower layer of memory cells, a middle layer of memory cells, and an upper layer of memory cells. The third planarization process may be or otherwise comprise, for example, a chemical-mechanical planarization (CMP), grinding, an etch, or some other suitable process. The second conductive material may be deposited by way of a deposition process (e.g., an atomic layer deposition (ALD) process, a chemical vapor deposition (CVD) process, a physical vapor deposition (PVD) process, a sputtering process, a plating process (e.g., an electroplating process, an electro-less plating process), or the like).

Figure 15:
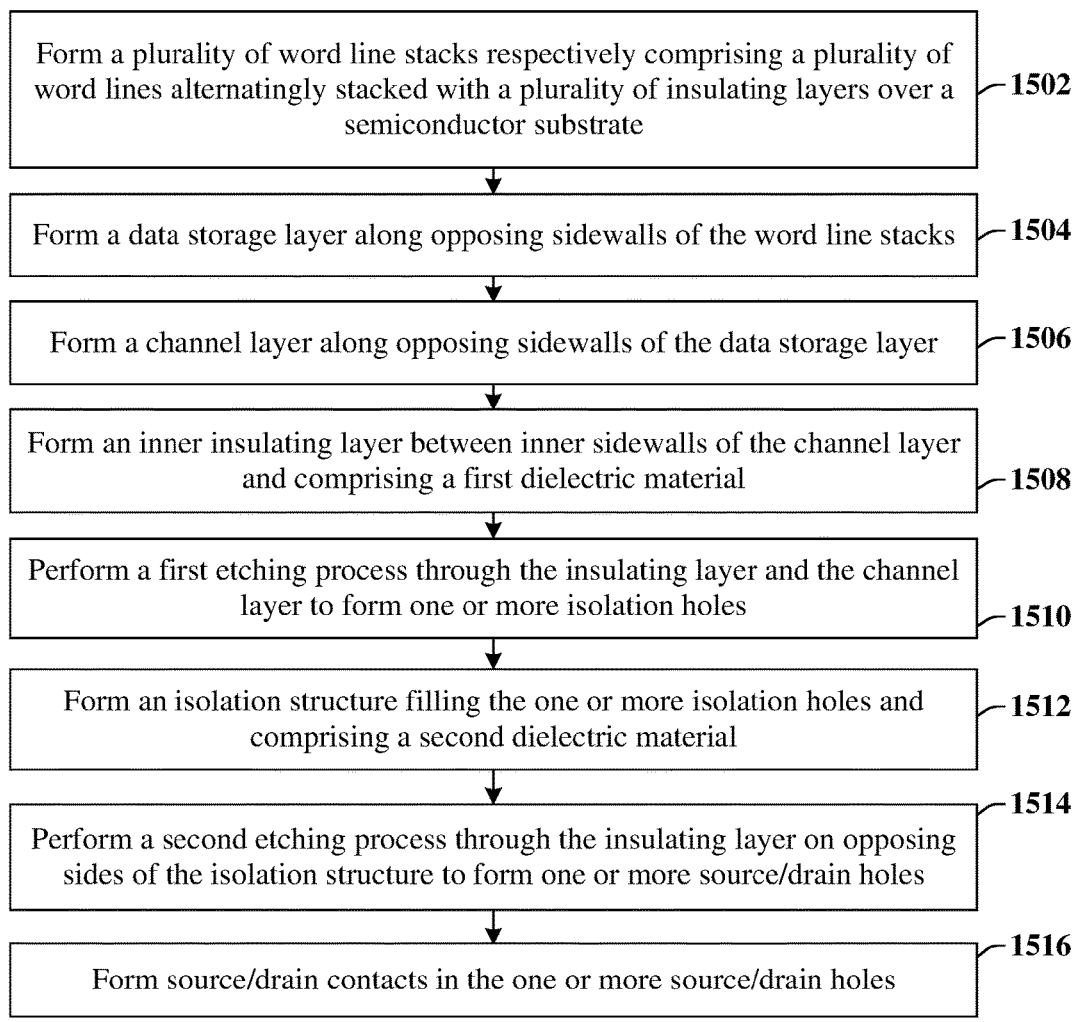
FIG. 15 illustrates a flowchart that depicts a manufacturing flow of a method for forming a memory device in accordance with some embodiments.

With respect to FIG. 15, a flowchart 1500 illustrates some embodiments of a method for forming a memory device comprising an isolation structure that may be etched with a high etching selectivity with respect to an inner insulating layer. The method may, for example, correspond to the method of FIGS. 3-14.

While the disclosed flowchart 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1502, a plurality of word line stacks is formed respectively comprising a plurality of word lines alternatingly stacked with a plurality of insulating layers over a semiconductor substrate. FIGS. 3-5 illustrate top views 300A-500A and 3D views 300B-500B of some embodiments corresponding to act 1502.

At act 1504, a data storage layer is formed along opposing sidewalls of the word line stacks. FIG. 6 illustrates a top view 600A and an 3D view 600B of some embodiments corresponding to act 1504.

At act 1506, a channel layer is formed along opposing sidewalls of the data storage layer. FIG. 6 illustrates a top view 600A and an 3D view 600B of some embodiments corresponding to act 1506.

At act 1508, an inner insulating layer comprising a first dielectric material is formed between inner sidewalls of the channel layer. FIG. 6 illustrates a top view 600A and an 3D view 600B of some embodiments corresponding to act 1508.

At act 1510, an isolation cut process is performed including a first etching process to etch through the insulating layer and the channel layer to form an isolation opening. FIGS. 7-9 illustrate top views 700A-900A and 3D views 700B-900B of some embodiments corresponding to act 1510.

At act 1512, an isolation structure comprising a second dielectric material is formed, filling the isolation opening. FIG. 10 illustrates a top view 1000A and an 3D view 1000B of some embodiments corresponding to act 1512.

At act 1514, a second etching process is performed through the insulating layer on opposing sides of the isolation structure to form source/drain openings. The inner insulating layer is etched with a high etching selectivity with respect to the isolation structure to eliminate etching damage to the isolation structure during the etching of the source/drain openings. This, in turn, effectively separates adjacent memory cell pairs, improving an effectiveness of the memory device. FIGS. 11-13 illustrate top views 1100A-1300A and 3D views 1100B-1300B of some embodiments corresponding to act 1514.

At act 1516, source/drain contacts are formed in the source/drain openings. FIG. 14 illustrates a top view 1400A and an 3D view 1400B of some embodiments corresponding to act 1516.

Accordingly, in some embodiments, the present disclosure relates to a method for forming a memory device, comprising forming a plurality of word line stacks respectively comprising a plurality of word lines alternatingly stacked with a plurality of insulating layers over a semiconductor substrate, forming a data storage layer along opposing sidewalls of the word line stacks, forming a channel layer along opposing sidewalls of the data storage layer, forming an inner insulating layer between inner sidewalls of the channel layer and comprising a first dielectric material, performing an isolation cut process including a first etching process through the inner insulating layer and the channel layer to form an isolation opening, forming an isolation structure filling the isolation opening and comprising a second dielectric material, performing a second etching process through the inner insulating layer on opposing sides of the isolation structure to form source/drain openings, and forming source/drain contacts in the source/drain openings.

In other embodiments, the present disclosure relates to a method for forming a memory device, comprising forming a plurality of word lines alternatingly stacked with a plurality of insulating layers over a semiconductor substrate, etching a plurality of trenches into the plurality of word lines, defining inner sidewalls of the plurality of word lines, forming a ferroelectric data storage layer along the inner sidewalls of the plurality of word lines, forming a channel layer along the inner sidewalls of the ferroelectric data storage layer, forming an inner insulating layer between inner sidewalls of the channel layer and comprising a first material, etching the channel layer and the inner insulating layer to form an opening, wherein the opening extends continuously from an inner sidewall of the ferroelectric data storage layer to an opposing inner sidewall of the ferroelectric data storage layer, forming an isolation structure into the opening, wherein the isolation structure comprises a second material that is highly etching selective to the first material, and a first pair of opposing sidewalls that laterally extend past opposing outer sidewalls of the inner insulating layer, and etching the inner insulating layer and forming a pair of source/drain contacts on opposing sides of the isolation structure.

In yet other embodiments, the present disclosure relates to a memory device, comprising a semiconductor substrate, a plurality of word line stacks respectively comprising word lines and insulating layers alternatingly stacked over the semiconductor substrate, the word lines extending generally in a first direction and in parallel with an upper surface of the semiconductor substrate, a ferroelectric data storage layer extending in the first direction along opposing inner sidewalls of the word line stacks, a channel layer extending in the first direction, disposed along opposing inner sidewalls of the ferroelectric data storage layer, a pair of source/drain regions disposed between opposing inner sides of the channel layer and extending generally perpendicular to the upper surface of the semiconductor substrate and generally perpendicular to the word lines, the pair of source/drain regions separated from one another by an insulating structure of a first dielectric material along the first direction, and an isolation structure disposed on ends of the channel layer and the pair of source/drain regions and arranged between opposing sidewalls of the ferroelectric data storage layer, wherein the isolation structure comprises a second dielectric material different from the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
    forming a plurality of word line stacks respectively comprising a plurality of word lines alternatingly stacked with a plurality of insulating layers over a semiconductor substrate;
    forming a data storage layer along opposing sidewalls of the word line stacks;
    forming a channel layer along opposing sidewalls of the data storage layer;
    forming an inner insulating layer between inner sidewalls of the channel layer and comprising a first dielectric material;
    performing an isolation cut process including a first etching process through the inner insulating layer and the channel layer to form an isolation opening;
    forming an isolation structure filling the isolation opening and comprising a second dielectric material;
    performing a second etching process through the inner insulating layer on opposing sides of the isolation structure to form source/drain openings; and
    forming source/drain contacts in the source/drain openings.

2. The method according to claim 1, further comprising:
    forming a dielectric layer along inner sidewalls of the channel layer before forming the inner insulating layer.

3. The method according to claim 2, wherein the first etching process comprises:
    etching an insulating opening into the inner insulating layer, leaving portions of the dielectric layer exposed;
    laterally etching the dielectric layer, leaving portions of the channel layer exposed; and
    laterally etching the channel layer to define the isolation opening.

4. The method according to claim 2, wherein the second etching process comprises:
    etching portions of the inner insulating layer on opposing sides of the isolation structure to form openings, leaving first portions of the dielectric layer exposed;
    laterally etching the first portions of the dielectric layer, leaving portions of the channel layer exposed; and
    performing a pullback etch on the inner insulating layer on the opposing sides of the isolation structure, leaving second portions of the dielectric layer exposed and defining the source/drain openings.

5. The method according to claim 1, wherein the second dielectric material is different than the first dielectric material.

6. The method according to claim 1, wherein outer sidewalls of the source/drain contacts are laterally separated from outer sidewalls of the inner insulating layer.

7. The method according to claim 1, wherein the data storage layer comprises a ferroelectric material.

8. The method according to claim 1, wherein the second dielectric material comprises a metal oxide or is oxide-doped.

9. The method according to claim 1, wherein the first dielectric material may be etched with an etching selectivity with respect to the second dielectric material of greater than 1000:1.

10. A method for forming a memory device, comprising:
    forming a plurality of word lines alternatingly stacked with a plurality of insulating layers over a semiconductor substrate;
    etching a plurality of trenches into the plurality of word lines, defining inner sidewalls of the plurality of word lines;
    forming a ferroelectric data storage layer along the inner sidewalls of the plurality of word lines;
    forming a channel layer along the inner sidewalls of the ferroelectric data storage layer;
    forming an inner insulating layer between inner sidewalls of the channel layer and comprising a first material;
    etching the channel layer and the inner insulating layer to form an opening, wherein the opening extends continuously from an inner sidewall of the ferroelectric data storage layer to an opposing inner sidewall of the ferroelectric data storage layer;
    forming an isolation structure into the opening, wherein the isolation structure comprises a second material that is highly etching selective to the first material, and a first pair of opposing sidewalls that laterally extend past opposing outer sidewalls of the inner insulating layer; and etching the inner insulating layer and forming a pair of source/drain contacts on opposing sides of the isolation structure.

11. The method according to claim 10, wherein each of the pair of source/drain contacts comprises:

a first portion contacting the isolation structure; and a second portion contacting the inner insulating layer and comprising sidewalls connected to sidewalls of the first portion by a laterally extending surface, wherein sidewalls of the second portion are laterally between sidewalls of the first portion.

12. The method according to claim 10, further comprising:

forming a dielectric layer along inner sidewalls of the channel layer before forming the inner insulating layer.

13. The method according to claim 12, wherein etching the opening comprises:

etching an insulating opening into the inner insulating layer, leaving portions of the dielectric layer exposed;

laterally etching the dielectric layer after etching the insulating opening, leaving portions of the channel layer exposed; and laterally etching the channel layer after etching the insulating opening, leaving portions of the ferroelectric data storage layer exposed and defining the opening.

14. The method according to claim 13, wherein the isolation structure is formed between and contacting the ferroelectric data storage layer.

15. The method according to claim 10, wherein the first pair of opposing sidewalls of the isolation structure are parallel and contact the pair of source/drain contacts.

16. The method according to claim 10, wherein the isolation structure comprises a second pair of opposing sidewalls, and wherein after forming the pair of source/drain contacts, the isolation structure has a constant width extending continuously between the second pair of opposing sidewalls.

17. A method to form memory device, comprising:

forming a plurality of word line stacks respectively comprising word lines and insulating layers alternatingly stacked over a substrate, the word lines extending in a first direction and in parallel with an upper surface of the substrate;

forming a ferroelectric data storage layer extending in the first direction along opposing inner sidewalls of the word line stacks;

forming a channel layer extending in the first direction, disposed along opposing inner sidewalls of the ferroelectric data storage layer;

forming an insulating layer of a first dielectric material along the first direction filing a space between opposing inner sidewalls of the channel layer;

patterning the channel layer and the insulating layer to form an isolation opening;

forming an isolation structure in the isolation opening on ends of the channel layer and the insulating layer, wherein the isolation structure comprises a second dielectric material different from the first dielectric material;

etching back the insulating layer to form source/drain openings; and forming a pair of source/drain regions in the source/drain openings between opposing inner sides of the channel layer and separating from one another by the insulating layer.

18. The method according to claim 17, wherein the second dielectric material is highly etching selective to the first dielectric material.

19. The method according to claim 17, further comprising:

forming a high-k dielectric layer along inner sidewalls of the channel layer prior to forming the insulating layer, wherein the high-k dielectric layer has ends formed between the channel layer and the insulating layer along the first direction.

20. The method according to claim 19, wherein the pair of source/drain regions is formed with a first pair of outer sidewalls of contacting the high-k dielectric layer and a second pair of outer sidewalls contacting the channel layer.

* * * * *